United States Patent [19]

Waterson

[11] Patent Number: 5,541,935

[45] Date of Patent: Jul. 30, 1996

[54] INTEGRATED CIRCUIT WITH TEST SIGNAL BUSES AND TEST CONTROL CIRCUITS

[75] Inventor: Kent B. Waterson, Everman, Tex.

[73] Assignee: National Semiconductor Corporation, Santa Clara, Calif.

[21] Appl. No.: 450,726

[22] Filed: May 26, 1995

[51] Int. Cl.$^6$ .................................................. G06F 11/00
[52] U.S. Cl. .................... 371/22.5; 371/22.3; 395/183.06
[58] Field of Search .................... 395/183.03, 183.06; 371/22.5, 22.3, 22.6, 27

[56] References Cited

U.S. PATENT DOCUMENTS

| | | | |
|---|---|---|---|
| 5,189,319 | 2/1993 | Fung et al. | 307/452 |
| 5,204,953 | 4/1993 | Dixit | 395/400 |
| 5,254,888 | 10/1993 | Lee et al. | 307/480 |
| 5,259,006 | 11/1993 | Price et al. | 375/107 |
| 5,404,473 | 4/1995 | Papworth et al. | 395/375 |
| 5,408,626 | 4/1995 | Dixit | 395/400 |
| 5,483,518 | 1/1996 | Whetsel | 370/13 |

OTHER PUBLICATIONS

Serra, Micaela & Dervisoglu, Bulent I, "Testing", Chapter 79, *The Electrical Engineering Handbook,* Richard C. Dorf, Editor–in–Chief, pp. 1808–1837, CRC Press.

L–T Wang et al., "Feedback Shift Registers For Self–Testing Circuits", *VLSI Systems Design,* Dec. 1986.

Masakazu Shoji, "CMOS Dynamic Gates", Chapter 5, *AT&T CMOS Digital Circuit Technology,* Prentice Hall, 1988, pp. 210–257.

Guthrie, Charles, "Power–On Sequencing For Liquid Crystal Displays; Why, When, And How", *Sharp Application Notes,* Sharp Corporation, 1994, pp. 2–1 thru 2–9.

Bernd Moeschen, "NS32SP160–Feature Communication Controller Architecture Specification", *National Semiconductor,* Rev. 1.0, May 13, 1993.

Agarwal, Rakesh K., *80×86 Architecture and Programming, vol. II: Architecture Reference,* Chapter 4, Prentice Hall, 1991, pp. 542–543.

Intel486 Microprocessor Family Programmer's Reference Manual, Intel Corporation, 1993.

"8237A High Performance Programmable DMA Controller (8237A, 8237A–4, 8237A–5)", *Peripheral Components,* Intel, 1992, pp. 3–14 thru 3–50.

Kane, Gerry, "R2000 Processor Programming Model", Chapter 2, *MIPS RISC Architecture,* MIPS Computer Systems, Inc.

Hennessy, John, et al., "Interpreting Memory Addresses", *Computer Architecture A Quantitative Approach,* pp. 95–97, Morgan Kaufmann Publishers, Inc. 1990.

*PowerPC601 Reference Manual,* IBM, 1994, Chapter 9, "System Interface Operation", pp. 9–15 thru 9–17.

Intel Corp. Miscrosoft Corp., *Advanced Power Management (APM) BIOS Interface Specification,* Revision 1.1, Sep. 1993.

Intel Corporation, *i486 Micro Processor Hardware Reference Manual,* Processor Bus, pp. 3–28 thru 3–32.

*Primary Examiner*—Vincent P. Canney
*Attorney, Agent, or Firm*—Limbach & Limbach L.L.P.

[57] ABSTRACT

An integrated circuit (IC) with multiple input-only, output-only and combination input/output terminals which can be functionally tested at both the IC and circuit board levels includes programmably-designated, internal test signal buses for allowing functional tests to be performed upon portions of the IC not normally accessible via its outside terminals. Programmably-controlled signal switches allow input and output test signals to be routed directly to and from those functional areas of the IC sought to be tested. Further included are a logic circuit for logically ANDing all of the input signals and programmably-controlled output signal buffers for selectively driving each output terminal to a logic zero, logic one or high impedance state, thereby allowing tests to be conducted to ensure that the various input and output terminals are not electrically shorted to one another or circuit ground.

19 Claims, 11 Drawing Sheets

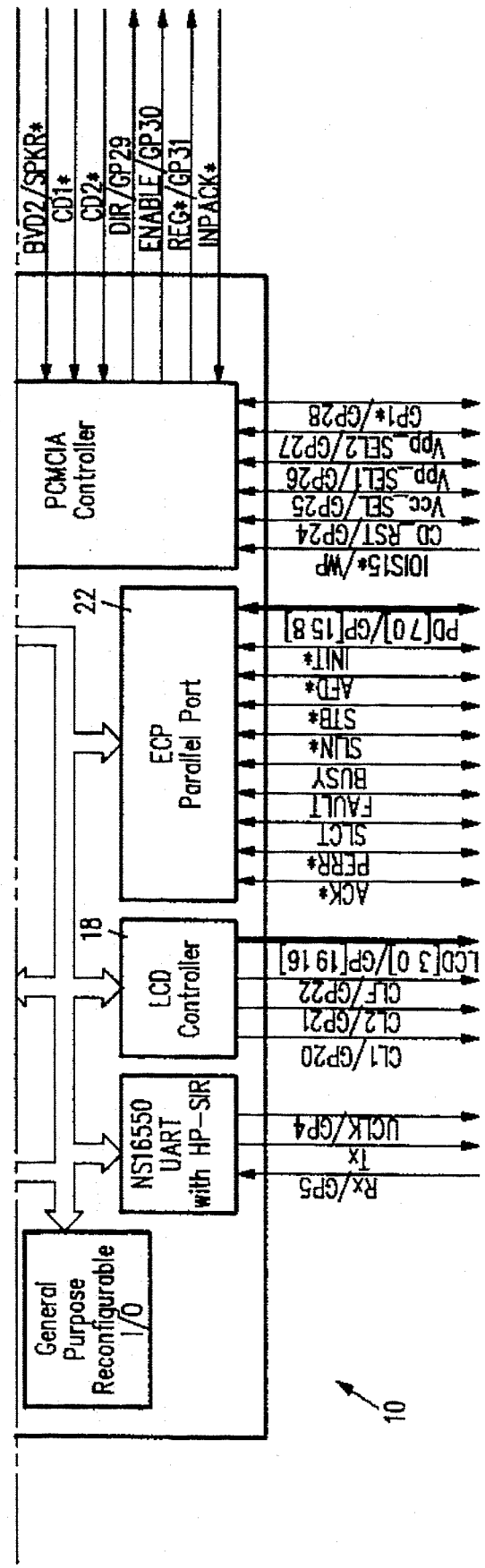
FIG. 1B
NOTE Active Low Signals followed by *
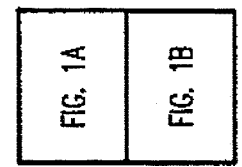
KEY TO FIG. 1

KEY TO FIG. 2

| FIG. 2A |
|---|
| FIG. 2B |

| IRQ5 | IRQ4 | IRQ3 | IRQ2 | IRQ1 | IRQ0 | Mode Name | Description |
|---|---|---|---|---|---|---|---|
| 0 | 0 | 0 | 0 | 0 | 0 | TestMode 0 | CPU-TBD |
| 0 | 0 | 0 | 0 | 0 | 1 | TestMode 1 | CPU-TBD |
| 0 | 0 | 0 | 0 | 1 | 0 | TestMode 2 | CPU-CG & Dumping PC chain |
| 0 | 0 | 0 | 0 | 1 | 1 | TestMode 3 | CPU-CG & Dumping PC chain |
| 0 | 0 | 0 | 1 | 0 | 0 | TestMode 4 | CPU-CG & Dumping PC chain |
| 0 | 0 | 0 | 1 | 0 | 1 | TestMode 5 | CPU-CG & Dumping PC chain |
| 0 | 0 | 0 | 1 | 1 | 0 | TestMode 6 | CPU-US & Dumping uROM |
| 0 | 0 | 0 | 1 | 1 | 1 | TestMode 7 | CPU-US & Dumping uROM |
| 0 | 0 | 1 | 0 | 0 | 0 | TestMode 8 | CPU-Testing Cache |
| 0 | 0 | 1 | 0 | 0 | 1 | TestMode 9 | CPU-Testing Cache |
| 0 | 0 | 1 | 0 | 1 | 0 | TestMode 10 | CPU-Testing PLU |
| 0 | 0 | 1 | 0 | 1 | 1 | TestMode 11 | CPU-Testing BU |
| 0 | 0 | 1 | 1 | 0 | 0 | TestMode 12 | CPU-Testing RF |
| 0 | 0 | 1 | 1 | 0 | 1 | TestMode 13 | CPU-Testing DC |
| 0 | 0 | 1 | 1 | 1 | 0 | TestMode 14 | CPU-Testing PF |
| 0 | 0 | 1 | 1 | 1 | 1 | TestMode 15 | CPU-CPU runs in stand alone mode |
| 0 | 1 | 0 | 0 | 0 | 0 | TestMode 16 | UART Cell Test |
| 0 | 1 | 0 | 0 | 0 | 1 | TestMode 17 | Serial Block Test |
| 0 | 1 | 0 | 0 | 1 | 0 | TestMode 18 | Power Management |
| 0 | 1 | 0 | 0 | 1 | 1 | TestMode 19 | Power Management |
| 0 | 1 | 0 | 1 | 0 | 0 | TestMode 20 | Power Management |
| 0 | 1 | 0 | 1 | 0 | 1 | TestMode 21 | Interrupt Controller |
| 0 | 1 | 0 | 1 | 1 | 0 | TestMode 22 | Real Time Clock |
| 0 | 1 | 0 | 1 | 1 | 1 | TestMode 23 | LCD Controller |
| 0 | 1 | 1 | 0 | 0 | 0 | TestMode 24 | 3 Wire Interface |
| 0 | 1 | 1 | 0 | 0 | 1 | TestMode 25 | T.B.D. (Timer) |
| 0 | 1 | 1 | 0 | 1 | 0 | TestMode 26 | T.B.D. (ECP) |
| 0 | 1 | 1 | 0 | 1 | 1 | TestMode 27 | T.B.D. (DMA signal mux) |

FIG. 6A

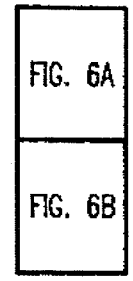

KEY TO FIG. 6

| | | | | | | | |
|---|---|---|---|---|---|---|---|
| 0 | 1 | 1 | 1 | 0 | 0 | TestMode 28 | T.B.D. |
| 0 | 1 | 1 | 1 | 0 | 1 | TestMode 29 | T.B.D. |
| 0 | 1 | 1 | 1 | 1 | 0 | TestMode 30 | T.B.D. |
| 0 | 1 | 1 | 1 | 1 | 1 | TestMode 31 | T.B.D. |
| 1 | 0 | 0 | 0 | 0 | 0 | TestMode 32 | T.B.D. |
| 1 | 0 | 0 | 0 | 0 | 1 | TestMode 33 | T.B.D. |
| 1 | 0 | 0 | 0 | 1 | 0 | TestMode 34 | T.B.D. |
| 1 | 0 | 0 | 0 | 1 | 1 | TestMode 35 | T.B.D. |
| 1 | 0 | 0 | 1 | 0 | 0 | TestMode 36 | T.B.D. |
| 1 | 0 | 0 | 1 | 0 | 1 | TestMode 37 | T.B.D. |
| 1 | 0 | 0 | 1 | 1 | 0 | TestMode 38 | T.B.D. |
| 1 | 0 | 0 | 1 | 1 | 1 | TestMode 39 | T.B.D. |
| 1 | 0 | 1 | 0 | 0 | 0 | TestMode 40 | T.B.D. |
| 1 | 0 | 1 | 0 | 0 | 1 | TestMode 41 | T.B.D. |
| 1 | 0 | 1 | 0 | 1 | 0 | TestMode 42 | T.B.D. |
| 1 | 0 | 1 | 0 | 1 | 1 | TestMode 43 | T.B.D. |
| 1 | 0 | 1 | 1 | 0 | 0 | TestMode 44 | T.B.D. |
| 1 | 0 | 1 | 1 | 0 | 1 | TestMode 45 | T.B.D. |
| 1 | 0 | 1 | 1 | 1 | 0 | TestMode 46 | T.B.D. |
| 1 | 0 | 1 | 1 | 1 | 1 | TestMode 47 | T.B.D. |
| 1 | 1 | 0 | 0 | 0 | 0 | TestMode 48 | T.B.D. |
| 1 | 1 | 0 | 0 | 0 | 1 | TestMode 49 | T.B.D. |
| 1 | 1 | 0 | 0 | 1 | 0 | TestMode 50 | T.B.D. |
| 1 | 1 | 0 | 0 | 1 | 1 | TestMode 51 | T.B.D. |
| 1 | 1 | 0 | 1 | 0 | 0 | TestMode 52 | T.B.D. |
| 1 | 1 | 0 | 1 | 0 | 1 | TestMode 53 | T.B.D. |
| 1 | 1 | 0 | 1 | 1 | 0 | TestMode 54 | T.B.D. |
| 1 | 1 | 0 | 1 | 1 | 1 | TestMode 55 | T.B.D. |
| 1 | 1 | 1 | 0 | 0 | 0 | TestMode 56 | T.B.D. |
| 1 | 1 | 1 | 0 | 0 | 1 | TestMode 57 | T.B.D. |
| 1 | 1 | 1 | 0 | 1 | 0 | TestMode 58 | T.B.D. |
| 1 | 1 | 1 | 0 | 1 | 1 | TestMode 59 | Drive all outputs high |
| 1 | 1 | 1 | 1 | 0 | 0 | TestMode 60 | Drive all output low |
| 1 | 1 | 1 | 1 | 0 | 1 | TestMode 61 | Tri-State all outputs |
| 1 | 1 | 1 | 1 | 1 | 0 | TestMode 62 | AND all inputs |
| 1 | 1 | 1 | 1 | 1 | 1 | TestMode 63 | Toggle adjacent outputs |

FIG. 6B

| Bit | Top Level Pin | Serial | PIC | Pwr Mngt | RTC | LCD | 3-Wire | ECP | Timers |
|---|---|---|---|---|---|---|---|---|---|
| 0 | DRQ6 | | CS_MASTER_IN_Z | Cs_power | DATA_OUT_EN | Cs_lcd | CS_3WRE_Z | CSZ | CS_ |
| 1 | DRQ4 | | CS_SLAVE2_IN_Z | Idlack | RTC_CSZ | Dock_z | CS_I | DMACKZ | G2 |
| 2 | DRQ2 | | *not used* | Int | | Test_en | | TC | |
| 3 | DRQ0 | | IRQ6_IN (via Config) | Nmi | | Test_mode | | | |
| 4 | EACK_Z | | IRQ7_IN (via Config) | Pup3v | | | | | |
| 5 | IOIS16_Z | | IRQ8_IN (via Config) | Test | | | | | |
| 6 | BVD2_SPKR_Z | | IRQ9_IN (via Config) | Test_lv_en | | | | | |
| 7 | BVD1_STSCNG_Z | | IRQ10_IN (via Config) | Test_hi_lowz | | | | | |
| 8 | CS0_Z(CA[31]) | | IRQ11_IN (via Config) | | | | | | |
| 9 | CS1_Z(CA[30]) | | IRQ12_IN (via Config) | | | | | | |
| 10 | CS2_Z(CA[29]) | | IRQ13_IN (via Config) | | | | | | |
| 11 | CS3_Z(CA[28]) | | IRQ14_IN (via Config) | | | | | | |
| 12 | CS4_Z(CA[27]) | | IRQ15_IN (via Config) | | | | | | |
| 13 | CS5_Z(CA[26]) | | | | | | | | |
| 14 | CD1_Z(inverted) | | | | | | | | |
| 15 | CD2_Z(inverted) | | | | | | | | |

| Bit | Top Level Pin | Serial | PIC | Pwr Mngt | RTC | LCD | 3-Wire | ECP | Timers |
|---|---|---|---|---|---|---|---|---|---|
| 0 | DACK6_Z | | LEVEL_MASTER_OUT | Drvcon | cntr_present_state_0 | Int | WIRE3_INT_BUF | DATA_OE | OEN |
| 1 | DACK4_Z | | LEVEL_SLAVE2_OUT | Gen_Int | Lockout | Eop_z | | DMA_MODE_ENABLE | OUT2 |
| 2 | DACK2_Z | | INT_OUT | Idlreq | RTC_2HZ | Drq | | ECP_IRQ 3 | |
| 3 | DACK0_Z | | SLAVES_OUT[0] | Osc_disable_z | RTC_CE | | | ECP_IRQ 4 | |
| 4 | TC_EOP_Z | | SLAVES_OUT[1] | Power_recycle | RTC_1KHZ | | | ECP_IRQ 5 | |
| 5 | EREQ_Z | | SLAVES_OUT[2] | D3ven | RTC_64HZ | | | ECP_IRQ 6 | |
| 6 | DRV_Z | | SLAVES_OUT[3] | Three | VRT | | | ECP_IRQ 7 | |
| 7 | CD_RST | | SLAVES_OUT[4] | | VPP | | | ECP_IRQ 9 | |
| 8 | VCC_SEL | | SLAVES_OUT[5] | | DATA_OUT_CTL | | | ECP_IRQ 10 | |
| 9 | VPP_SEL1 | | SLAVES_OUT[6] | | RTC_CLK | | | ECP_IRQ 11 | |
| 10 | VPP_SEL2 | | SLAVES_OUT[7] | | IRQZ | | | ECP_IRQ 12 | |
| 11 | GPI_Z | | INT_SLAVE2_OUT | | | | | ECP_IRQ 13 | |
| 12 | DIR | | | | | | | ECP_IRQ 14 | |
| 13 | ENABLE | | | | | | | Internal_AutoFD | |
| 14 | REG_Z | | | | | | | Internal_Strobe | |
| 15 | RESERVED | | | | | | | | |

TEST OUT BUS

| FIG. 7A |
|---|
| FIG. 7B |

KEY TO FIG. 7

INTEGRATED CIRCUIT WITH TEST SIGNAL BUSES AND TEST CONTROL CIRCUITS

BACKGROUND OF THE INVENTION

1. Field of the Invention

The present invention relates to functional testing techniques for complex integrated circuits, and in particular, to functional testing techniques which allow such circuits to be tested more completely in both a stand-alone manner and when mounted in a circuit assembly such as on a printed circuit board.

2. Description of the Related Art

As integrated circuits (ICs) have become more complex with higher levels of circuit integration, functional testing of such ICs has become more problematic. Not only are more and more functions integrated into such ICs, thereby requiring significantly more with respect to both the number and types of functional tests, but also with so many functions built in, along with their necessary input and output connections, the sharing of package pins for input and output connections cause such tests to become increasingly complex and time consuming. Further, with integration techniques allowing such ICs to become smaller and smaller, as more and more functions are integrated into such circuits, a practical limitation is quickly encountered with respect to the number of pins which can be reasonably accommodated on the package. As the pins and the spacing between the pins become smaller and smaller, mounting such packaged ICs into circuit assemblies, e.g. on a printed circuit board, becomes more difficult with respect to avoiding misconnected or shorted pins. Accordingly, it would be desirable to have an improved system and method for allowing thorough functional testing of complex ICs which avoid these problems.

SUMMARY OF THE INVENTION

In accordance with the present invention, a complex integrated circuit (IC) having multiple input-only, output-only and combination input/output terminals can be tested at the IC and circuit board levels to ensure both proper logical functioning of the IC and proper mounting of the IC to the circuit board.

An IC in accordance with one embodiment of the present invention includes test signal buses for use in performing internal logic tests. In particular, such an IC includes: signal terminals for inputting a set of input signals and outputting a set of output signals; a first set of Ionic circuits for inputting a first set of logic signals and outputting a second set of logic signals; a second set of logic circuits, coupled to the signal terminals, for providing a first set of internal signals and receiving a second set of internal signals; a first test signal bus, coupled to some of the signal terminals, for receiving a first set of test signals therefrom; a first set of signal switches, coupled between the first test signal bus and the first set of logic circuits, for receiving the first set of internal signals and for receiving a first set of control signals and in accordance therewith communicating either the first set of internal signals or the first set of test signals to the first set of logic circuits as the first set of logic signals; a second test signal bus, coupled to some others of the signal terminals, for providing a second set of test signals thereto; and a second set of signal switches, coupled between the first set of logic circuits and the second test signal bus, for receiving a second set of control signals and in accordance therewith communicating the second set of logic signals either to the second test signal bus as the second set of test signals or to the second set of logic circuits as the second set of internal signals.

An IC in accordance with another embodiment of the present invention includes test control circuits for use in performing external logic tests. In particular, such an IC includes: a first set of signal terminals for inputting a first set of input signals; a second set of signal terminals for outputting a first set of output signals; a third set of signal terminals for selectively inputting a second set of input signals and outputting a second set of output signals; a first set of output drivers, coupled to the second set of signal terminals, for receiving a first set of control signals and in accordance therewith providing the first set of output signals, wherein each one of the first set of output signals is set to one of a number of logic states in accordance with the first set of control signals; a second set of output drivers, coupled to the third set of signal terminals, for receiving a second set of control signals and in accordance therewith providing the second set of output signals, wherein each one of the second set of output signals is set to one of a number of logic states in accordance with the second set of control signals; and a logic circuit, coupled to the first and third sets of signal terminals, for receiving the first and second sets of input signals and in accordance therewith providing an input status signal representing a logic status of the first and second sets of input signals.

These and other features and advantages of the present invention will be understood upon consideration of the following detailed description of the invention and the accompanying drawings.

BRIEF DESCRIPTION OF THE DRAWINGS

FIG. 6 is a table identifying the programmable test modes for testing the IC of FIG. 1 with test buses and test control circuits in accordance with the present invention.

FIG. 7 contains tables identifying the input and output test signal buses for the IC of FIG. 1.

DETAILED DESCRIPTION OF THE INVENTION

Figure 1A:
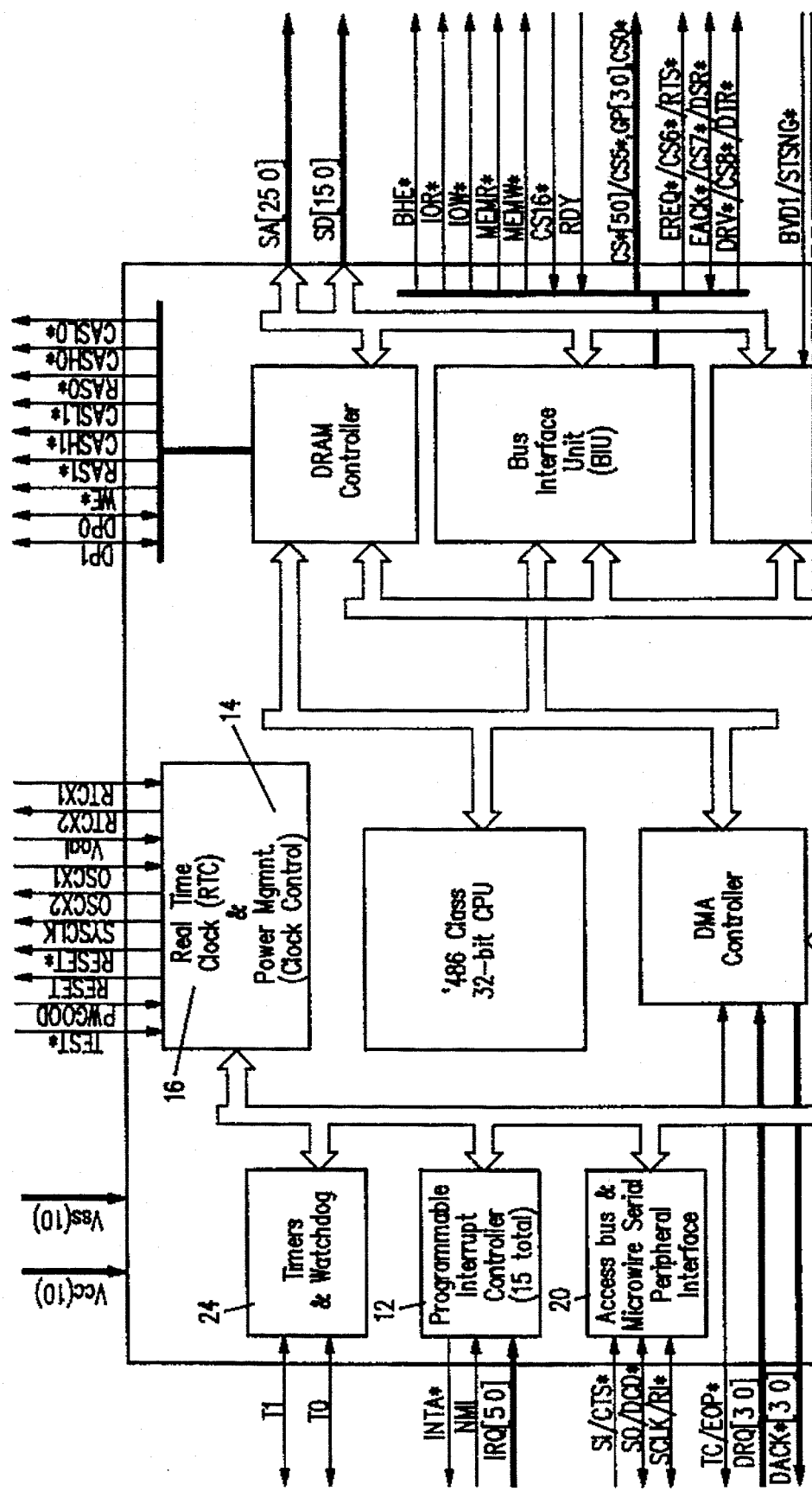
FIG. 1 is a functional block diagram of a complex IC suitable for use with and which embodies test signal buses and test control circuits in accordance with the present invention.

Referring to FIG. 1, an IC 10 in which a test system in accordance with the present invention has been implemented includes a number of functions integrated therein. For purposes of illustrating the use of such test system, the following discussion refers specifically to the programmable interrupt controller 12, power management controller 14, real time clock 16, LCD controller 18, MICROWIRE™ interface 20, ECP parallel port interface 22 and timers 24 (discussions regarding these, as well as other functions identified in FIG. 1, can be found in the patent documents identified further below.)

Figure 2A:
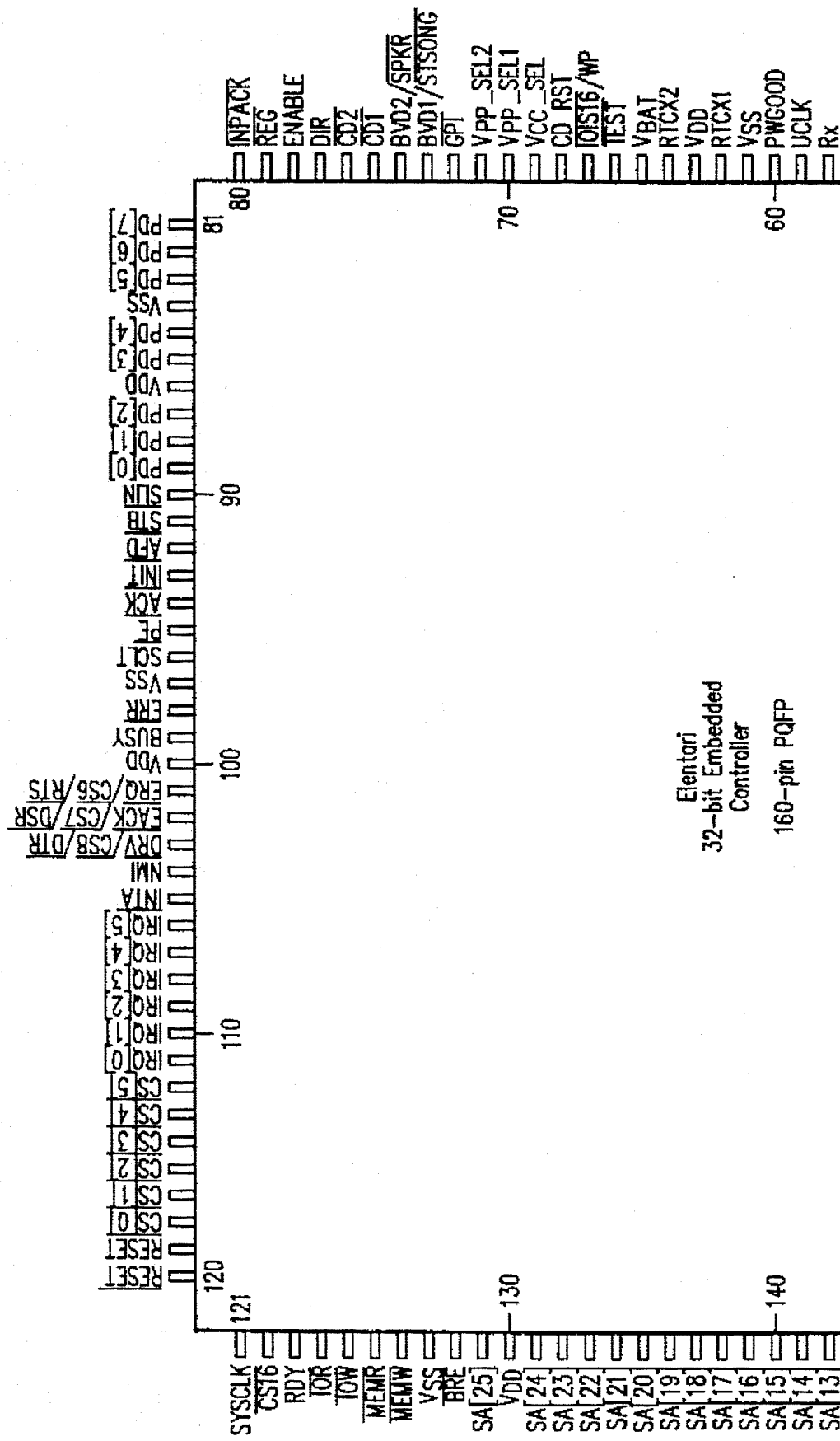
FIG. 2 illustrates the package containing the IC of FIG. 1, with its numerous signal pins illustrated and identified.
Figure 2B:
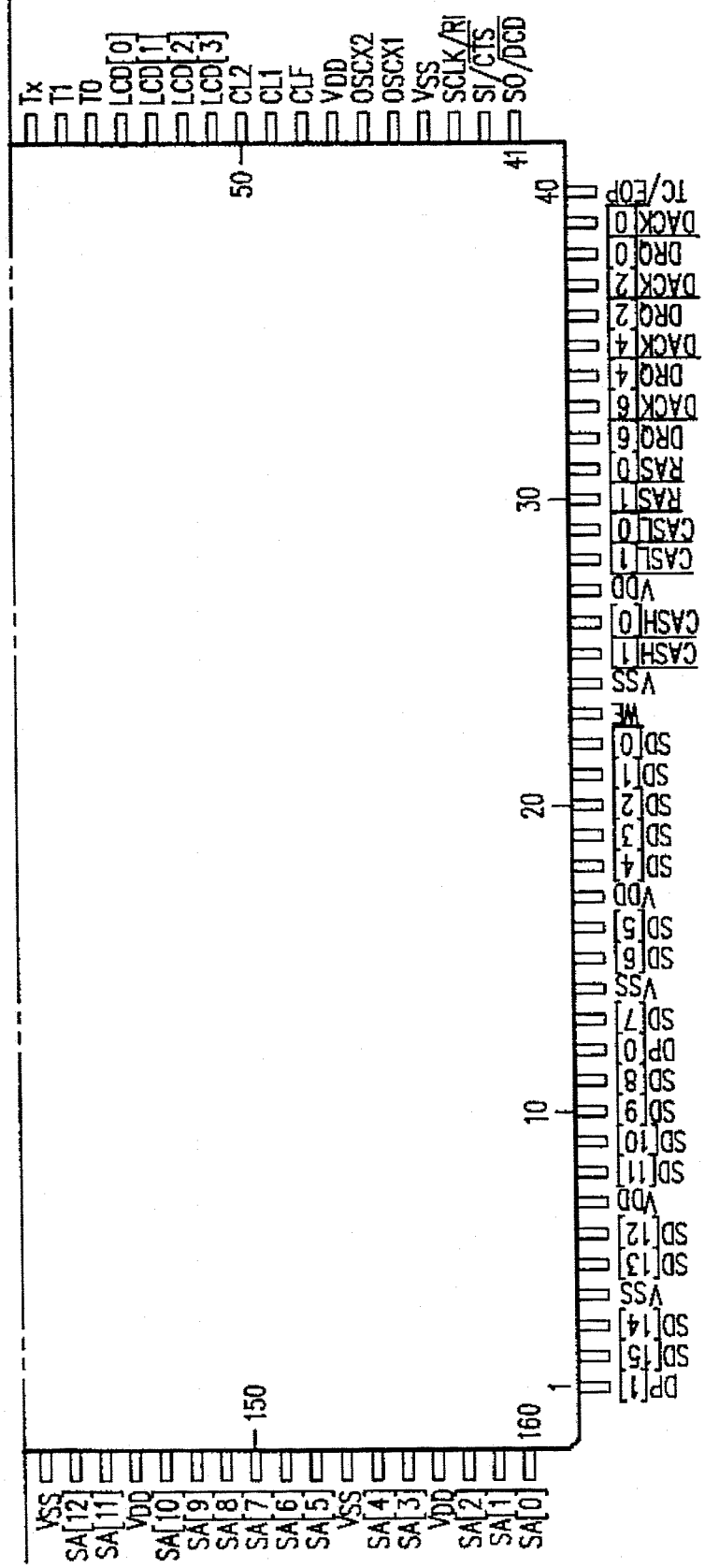

Referring to FIG. 2, a packaged IC 100 in which the IC 10 of FIG. 1 is contained has 160 pins providing all necessary connections to the IC 10 for power supplies, input signals and output signals. Such a package is well known in the art as a 160-lead plastic quad flatpack package (PQFP).

Figure 3:
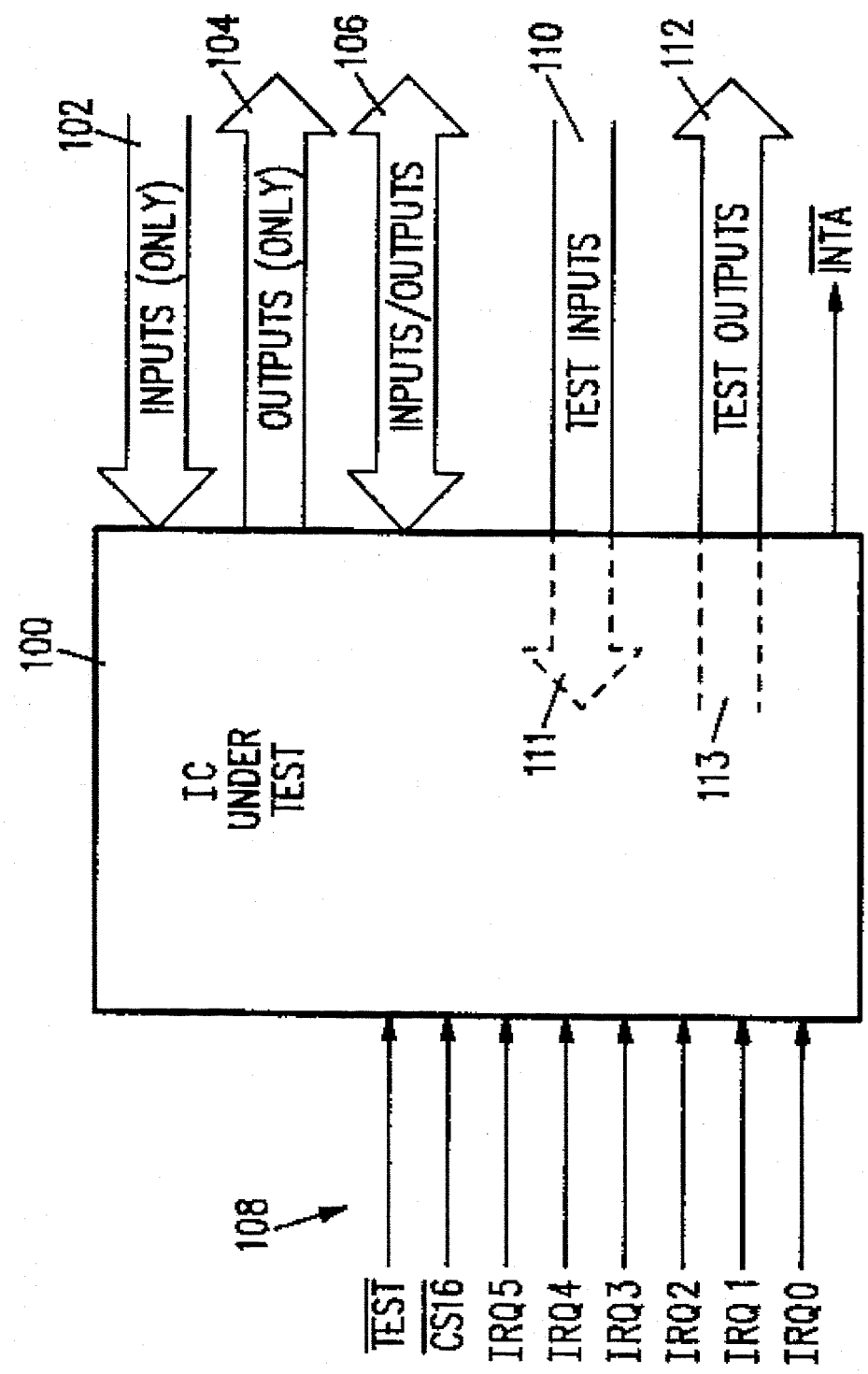
FIG. 3 is a functional diagram illustrating a principle behind test signal buses in accordance with the present invention.

Referring to FIG. 3, a packaged IC 100 in accordance with the present invention is functionally tested by applying input signals 102 to its dedicated input terminals, monitoring the output signals 104 at its dedicated output terminals and providing input signals and monitoring output signals 106 at the combination input/output terminals. Further, as discussed in more detail below, in accordance with a number of programmable test mode select signals 108, additional test input signals 110 and test output signals 112 can be applied and monitored, respectively, at package pins not otherwise associated with test signals during normal operation of the IC 100.

In accordance with the present invention, two types of test modes are available for the IC 100. One mode provides for production testing of the IC 100 by providing for testing of various internal function blocks which are not normally accessible from the external package pins. This is done by temporarily providing input 111 and output 113 connections to such function block, or combination of function blocks, when such test mode is selected. Otherwise, common signals, such as address signals, data signals, command strobes, etc., will be routed as part of the normal inputs 102, outputs 104 or combination(s) of inputs/outputs 106.

The other test mode available for the IC 100 provides for board-level testing, i.e. testing conducted after the IC 100 has been mounted in a circuit assembly such as on a printed circuit board. This test mode, in accordance with the test mode select signals 108, allows the output signals 104, 106 to be set at a logic 0, logic 1 or high impedance state. Additionally, adjacent ones of the outputs 104, 106 can be set at opposite logic states and toggled, thereby allowing adjacent pins to be tested for shorted or open connections to the circuit board and shorted connections to one another. (Such output signal toggling is accomplished by toggling test control signal /CS16 between a logic 1 and a logic 0 state.) Further, the input signals 102, 106 are logically ANDed with the result placed on the /INTA pin. This allows tests to be conducted whereby all input signals 102, 106 are set at a logic 1 so as to verify there are no open input connections. By then sequentially driving each input 102, 106 to a logic 0, the output /INTA can be monitored to verify that no input pins had been shorted together.

Figure 4:
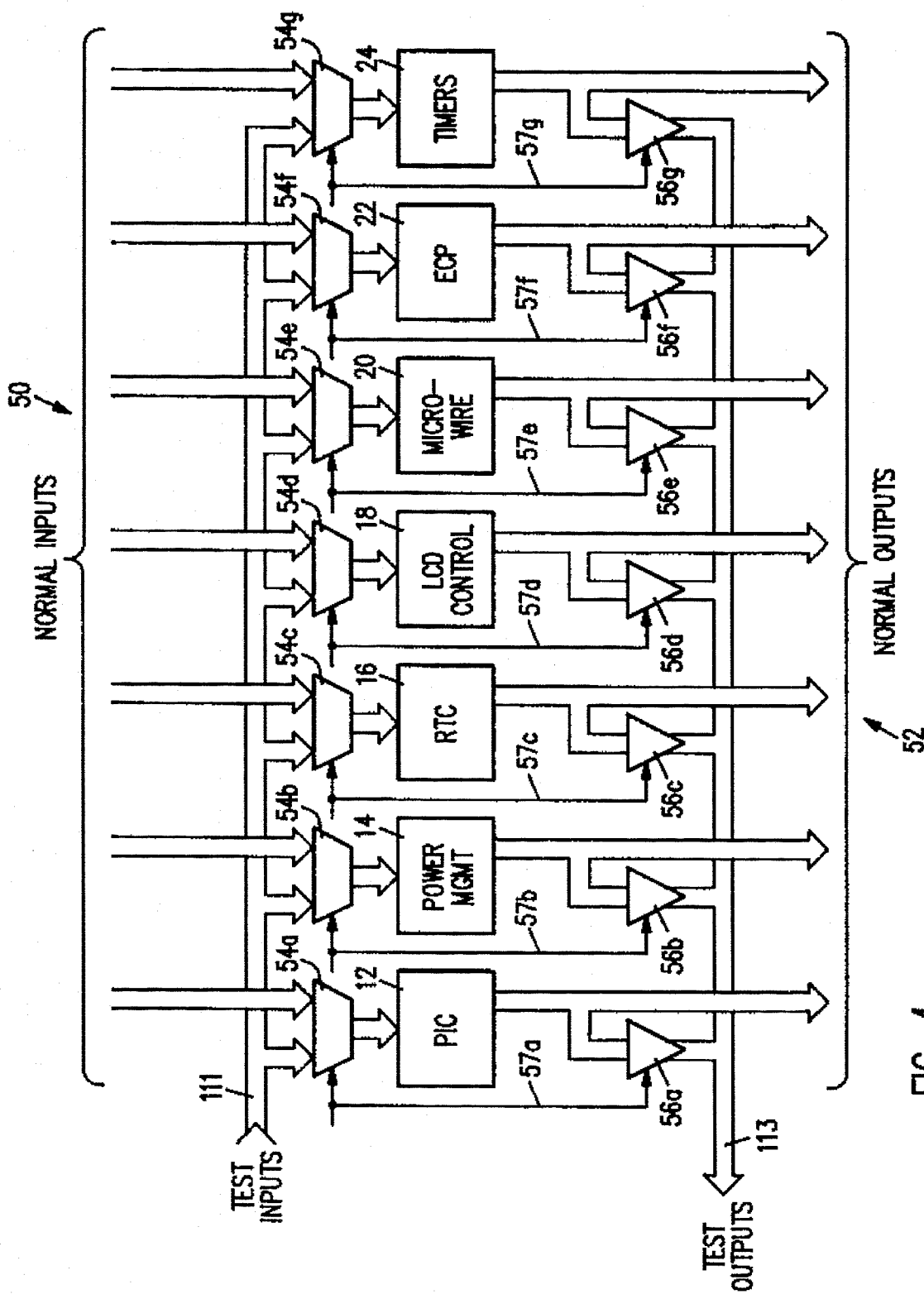
FIG. 4 is a functional block diagram illustrating the interconnection of various circuit functions in the IC of FIG. 1 with test signal buses in accordance with one embodiment of the present invention.

Referring to FIG. 4, interconnection and testing of the aforementioned functional blocks 12, 14, 16, 18, 20, 22, 24 within the packaged IC 100 with test signal buses 111, 113 in accordance with one embodiment of the present invention can be better understood. Coupled to the input and output of each of the functional blocks 12, 14, 16, 18, 20, 22, 24 to be tested is an input signal switch (e.g. multiplexor) 54 and output signal switch (e.g. tri-state buffer) 56, respectively, each of which is controlled by a switch control signal 57 which is determined by the test mode select signals 108 (FIG. 3). (It will be appreciated that the functions performed by the input 54 and output 56 signal switches can be realized by elements other than multiplexors and tri-state buffers, respectively, e.g. single-pole, double-throw switches and demultiplexors, respectively, or single-pole, double-throw switches for both.) During normal operation of the IC 100, these functional circuit blocks 12, 14, 16, 18, 20, 22, 24 receive their normal input signals 50 from other circuits within the IC chip 10 and provide their normal output signals 52 to other circuits within the IC chip 10. However, when the first test mode is selected via the test mode select signals 108 (discussed in more detail below), the switch control signals 57 control in the input 54 and output 56 signal switches so as to route the test inputs on the input test signal bus 111 to their inputs and direct their outputs to the output test signal bus 113 as test output signals.

Figure 5:
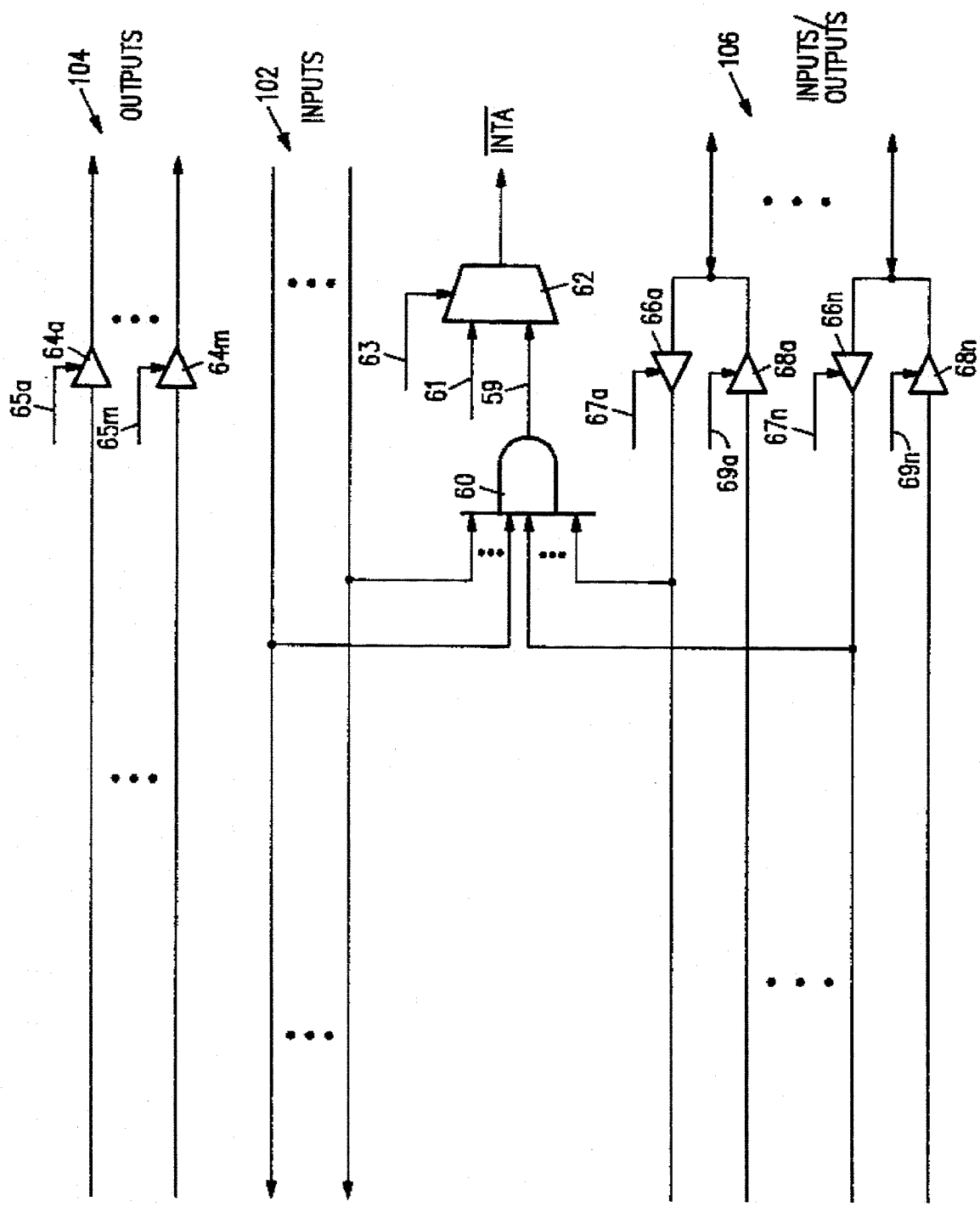
FIG. 5 is a schematic diagram illustrating test control circuits in accordance with another embodiment of the present invention for use in the IC of FIG. 1.

Referring to FIG. 5, the test control circuits for providing for board-level testing of the packaged IC 100 in accordance with another embodiment of the present invention includes an AND gate 60, signal switch (e.g. multiplexor) 62, output buffers 64 for the dedicated outputs 104, and input buffers 66 and output buffers 68 for the combination input/outputs 106. The output buffers 64 for the outputs 104 are controlled with buffer control signals 65 in accordance with which, as noted above, the output buffers 64 can be controlled to set the individual outputs 104 in a logic 0, logic 1 or high impedance state.

The inputs 102, 106 are logically ANDed in the AND gate 60, the result 59 of which is routed by the signal switch 62 in accordance with a switch control signal 63 to the /INTA pin. (During normal IC 10 operation, the normal /INTA signal 61 is routed to the /INTA pin.)

The inputs/outputs 106 are controlled with their input 66 and output 68 buffers in accordance with their respective buffer control signals 67, 69. As noted above, when these pins are acting as outputs, the output control signals 69 control the output buffers 68 in such a manner as to set the individual outputs at a logic 0, logic 1 or high impedance state. When these pins are acting as inputs, the input 66 and output 68 buffers cooperate, in response to their control signals 67, 69, to direct the input signals as appropriate, including to the AND gate 60, as discussed above.

Referring to FIG. 6, an IC 10/100 in accordance with the present invention has 64 test modes which are programmably selected by the aforementioned test mode select signals 108 (FIG. 3). When the active low /TEST signal is asserted, the test mode is selected in accordance with the bit pattern present on the interrupt request pins IRQ0–IRQ5. These test mode select signals IRQ0–IRQ5 are decoded in a manner well known in the art to generate the various aforementioned control signals 57, 63, 65, 67, 69. Accordingly, any and all of the IC-level and board-level test modes can be selected.

Referring to FIG. 7, the establishment of the input 111 and output 113 test signal buses can be better understood. Each signal bus includes 16 bus lines (15:0) whose corresponding package pins (FIG. 2) are identified in the second column of each table in FIG. 7. Of those 16 bus lines, those that are used for testing each of the exemplary functional blocks 12, 14, 16, 18, 20, 22, 24 are identified in the remaining columns of the tables shown in FIG. 7.

The above-referenced integrated circuit is further described in Appendix A (attached hereto and incorporated herein by reference) in which an embedded controller developed by the Assignee and embodying the present invention is described.

The invention embodiments described herein have been implemented in an integrated circuit which includes a number of additional functions and features which are described in the following co-pending, commonly assigned patent applications, the disclosure of each of which is incorporated herein by reference: U.S. patent application Ser. No. 08/458,319, entitled "DISPLAY CONTROLLER CAPABLE OF ACCESSING AN EXTERNAL MEMORY FOR GRAY SCALE MODULATION DATA" (atty. docket no. NSC1-62700); U.S. patent application Ser. No. 08/451,965, entitled "SERIAL INTERFACE CAPABLE OF OPERATING IN TWO DIFFERENT SERIAL DATA TRANSFER MODES" (atty. docket no. NSC1-62800); U.S. patent application Ser. No. 08/453,076, entitled "HIGH PERFORMANCE MULTIFUNCTION DIRECT MEMORY ACCESS (DMA) CONTROLLER" (atty. docket no. NSC1-62900); U.S. patent application Ser. No. 08/452,001, entitled "OPEN DRAIN MULTI-SOURCE CLOCK GENERATOR HAVING MINIMUM PULSE WIDTH" (atty. docket no. NSC1-63000); U.S. patent application Ser. No. 08/451,503, entitled "INTEGRATED CIRCUIT WITH MULTIPLE FUNCTIONS SHARING MULTIPLE INTERNAL SIGNAL BUSES ACCORDING TO DISTRIBUTED BUS ACCESS AND CONTROL ARBITRATION" (atty. docket no. NSC1-63100); U.S. patent application Ser. No. 08/451,924, entitled "EXECUTION UNIT ARCHITECTURE TO SUPPORT x86 INSTRUCTION SET AND x86 SEGMENTED ADDRESSING" (atty. docket no. NSC1-63300); U.S. patent application Ser. No. 08/451,444, entitled "BARREL SHIFTER" (atty. docket no. NSC1-63400); U.S. patent application Ser. No. 08/451,204, entitled "BIT SEARCHING THROUGH 8, 16, OR 32-BIT OPERANDS USING A 32-BIT DATA PATH" (atty. docket no. NSC1-63500); U.S. patent application Ser. No. 08/451,195, entitled "DOUBLE PRECISION (64-BIT) SHIFT OPERATIONS USING A 32-BIT DATA PATH" (atty. docket no. NSC1-63600); U.S. patent application Ser. No. 08/451,571, entitled "METHOD FOR PERFORMING SIGNED DIVISION" (atty. docket no. NSC1-63700); U.S. patent application Ser. No. 08/452,162, entitled "METHOD FOR PERFORMING ROTATE THROUGH CARRY USING A 32-BIT BARREL SHIFTER AND COUNTER" (atty. docket no. NSC1-63800); U.S. patent application Ser. No. 08/451,434, entitled "AREA AND TIME EFFICIENT FIELD EXTRACTION CIRCUIT" (atty. docket no. NSC1-63900); U.S. patent application Ser. No. 08/451,535, entitled "NON-ARITHMETICAL CIRCULAR BUFFER CELL AVAILABILITY STATUS INDICATOR CIRCUIT" (atty. docket no. NSC1-64000); U.S. patent application Ser. No. 08/445,563, entitled "TAGGED PREFETCH AND INSTRUCTION DECODER FOR VARIABLE LENGTH INSTRUCTION SET AND METHOD OF OPERATION" (atty. docket no. NSC1-64100); U.S. patent application Ser. No. 08/450,153, entitled "PARTITIONED DECODER CIRCUIT FOR LOW POWER OPERATION" (atty. docket no. NSC1-64200); U.S. patent application Ser. No. 08/451,495, entitled "CIRCUIT FOR DESIGNATING INSTRUCTION POINTERS FOR USE BY A PROCESSOR DECODER" (atty. docket no. NSC1-64300); U.S. patent application Ser. No. 08/451,219, entitled "CIRCUIT FOR GENERATING A DEMAND-BASED GATED CLOCK" (atty. docket no. NSC1-64500); U.S. patent application Ser. No. 08/451,214, entitled "INCREMENTOR/DECREMENTOR" (atty. docket no. NSC1-64700); U.S. patent application Ser. No. 08/451,150, entitled "A PIPELINED MICROPROCESSOR THAT PIPELINES MEMORY REQUESTS TO AN EXTERNAL MEMORY" (atty. docket no. NSC1-64800); U.S. patent application Ser. No. 08/451,198, entitled "CODE BREAKPOINT DECODER" (atty. docket no. NSC1-64900); U.S. patent application Ser. No. 08/445,569, entitled "TWO TIER PREFETCH BUFFER STRUCTURE AND METHOD WITH BYPASS" (atty. docket no. NSC1-65000); U.S. patent application Ser. No. 08/445,564, entitled "INSTRUCTION LIMIT CHECK FOR MICROPROCESSOR" (atty. docket no. NSC1-65100); U.S. patent application Ser. No. 08/452,306, entitled "A PIPELINED MICROPROCESSOR THAT MAKES MEMORY REQUESTS TO A CACHE MEMORY AND AN EXTERNAL MEMORY CONTROLLER DURING THE SAME CLOCK CYCLE" (atty. docket no. NSC1-65200); U.S. patent application Ser. No. 08/452,080, entitled "APPARATUS AND METHOD FOR EFFICIENT COMPUTATION OF A 486™ MICROPROCESSOR COMPATIBLE POP INSTRUCTION" (atty. docket no. NSC1-65700); U.S. patent application Ser. No. 08/450,154, entitled "APPARATUS AND METHOD FOR EFFICIENTLY DETERMINING ADDRESSES FOR MISALIGNED DATA STORED IN MEMORY" (atty. docket no. NSC1-65800); U.S. patent application Ser. No. 08/451,742, entitled "METHOD OF IMPLEMENTING FAST 486™ MICROPROCESSOR COMPATIBLE STRING OPERATION" (atty. docket no. NSC1-65900); U.S. patent application Ser. No. 08/452,659, entitled "A PIPELINED MICROPROCESSOR THAT PREVENTS THE CACHE FROM BEING READ WHEN THE CONTENTS OF THE CACHE ARE INVALID" (atty. docket no. NSC1-66000); U.S. patent application Ser. No. 08/451,507, entitled "DRAM CONTROLLER THAT REDUCES THE TIME REQUIRED TO PROCESS MEMORY REQUESTS" (atty. docket no. NSC1-66300); U.S. patent application Ser. No. 08/451,420, entitled "INTEGRATED PRIMARY BUS AND SECONDARY BUS CONTROLLER WITH REDUCED PIN COUNT" (atty. docket no. NSC1-66400); U.S. patent application Ser. No. 08/452,365, entitled "SUPPLY AND INTERFACE CONFIGURABLE INPUT/OUTPUT BUFFER" (atty. docket no. NSC1-66500); U.S. patent application Ser. No. 08/451,744, entitled "CLOCK GENERATION CIRCUIT FOR A DISPLAY CONTROLLER HAVING A FINE TUNEABLE FRAME RATE" (atty. docket no. NSC1-66600); U.S. patent application Ser. No. 08/451,206, entitled "CONFIGURABLE POWER MANAGEMENT SCHEME" (atty. docket no. NSC1-66700); U.S. patent application Ser. No. 08/452,350, entitled "BIDIRECTIONAL PARALLEL SIGNAL INTERFACE" (atty. docket no. NSC1-67000); U.S. patent application Ser. No. 08/452,094, entitled "LIQUID CRYSTAL DISPLAY (LCD) PROTECTION CIRCUIT" (atty. docket no. NSC1-67100); U.S. patent application Ser. No. 08/450,156, entitled "DISPLAY CONTROLLER CAPABLE OF ACCESSING GRAPHICS DATA FROM A SHARED SYSTEM MEMORY" (atty. docket no. NSC1-67500); U.S. patent application Ser. No. 08/450,726, entitled "INTEGRATED CIRCUIT WITH TEST SIGNAL BUSES AND TEST CONTROL CIRCUITS" (atty. docket no. NSC1-67600); U.S. patent application Ser. No. 08/445,560, entitled "DECODE BLOCK TEST METHOD AND APPARATUS" (atty. docket no. NSC1-68000).

Various other modifications and alterations in the structure and method of operation of this invention will be apparent to those skilled in the an without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including an integrated circuit (IC) with a plurality of test signal buses for use in performing a plurality of internal logic tests, said IC comprising:

a plurality of signal terminals for inputting a plurality of input signals and outputting a plurality of output signals;

a first plurality of logic circuits for inputting a first plurality of logic signals and outputting a second plurality of logic signals;

a second plurality of logic circuits, coupled to said plurality of signal terminals, for providing a first plurality of internal signals and receiving a second plurality of internal signals;

a first test signal bus, coupled to a portion of said plurality of signal terminals, for receiving a first plurality of test signals therefrom;

a first plurality of signal switches, coupled between said first test signal bus and said first plurality of logic circuits, for receiving said first plurality of internal signals and for receiving a first plurality of control signals and in accordance therewith communicating either said first plurality of internal signals or said first plurality of test signals to said first plurality of logic circuits as said first plurality of logic signals;

a second test signal bus, coupled to another portion of said plurality of signal terminals, for providing a second plurality of test signals thereto; and a second plurality of signal switches, coupled between said first plurality of logic circuits and said second test signal bus, for receiving a second plurality of control signals and in accordance therewith communicating said second plurality of logic signals either to said second test signal bus as said second plurality of test signals or to said second plurality of logic circuits as said second plurality of internal signals.

2. The apparatus of claim 1, wherein said plurality of input signal switches comprises a plurality of multiplexors.

3. The apparatus of claim 1, wherein said plurality of output signal switches comprises a plurality of tri-state buffers.

4. The apparatus of claim 1, wherein said plurality of output signal switches comprises a plurality of demultiplexors.

5. The apparatus of claim 1, further comprising a test controller for receiving a plurality of test control signals and in accordance therewith providing said first and second pluralities of control signals.

6. The apparatus of claim 5, wherein said plurality of test control signals comprises a test mode enablement signal and a plurality of programmable test mode select signals.

7. An apparatus including an integrated circuit (IC) with a plurality of test control circuits for use in performing a plurality of external logic tests, said IC comprising:

a first plurality of signal terminals for inputting a first plurality of input signals;

a second plurality of signal terminals for outputting a first plurality of output signals;

a third plurality of signal terminals for selectively inputting a second plurality of input signals and outputting a second plurality of output signals; a first plurality of output drivers, coupled to said second plurality of signal terminals, for receiving a first plurality of control signals and in accordance therewith providing said first plurality of output signals, wherein each one of said first plurality of output signals is set to one of a plurality of logic states in accordance with said first plurality of control signals;

a second plurality of output drivers, coupled to said third plurality of signal terminals, for receiving a second plurality of control signals and in accordance therewith providing said second plurality of output signals, wherein each one of said second plurality of output signals is set to one of a plurality of logic states in accordance with said second plurality of control signals; and a logic circuit, coupled to said first and third pluralities of signal terminals, for receiving said first and second pluralities of input signals and in accordance therewith providing an input status signal representing a logic status of said first and second pluralities of input signals.

8. The apparatus of claim 7, wherein each one of said first plurality of output signals is set to a logic zero, logic one or high impedance state in accordance with said first plurality of control signals.

9. The apparatus of claim 7, wherein each one of said second plurality of output signals is set to a logic zero, logic one or high impedance state in accordance with said second plurality of control signals.

10. The apparatus of claim 7, wherein said logic circuit comprises an AND gate.

11. An apparatus including an integrated circuit (IC) with a plurality of test signal buses and a plurality of test control circuits for use in performing pluralities of internal and external logic tests, said IC comprising:

a first plurality of signal terminals for inputting a first plurality of input signals;

a second plurality of signal terminals for outputting a first plurality of output signals;

a third plurality of signal terminals for selectively inputting a second plurality of input signals and outputting a second plurality of output signals;

a first plurality of logic circuits for inputting a first plurality of logic signals and outputting a second plurality of logic signals;

a second plurality of logic circuits, coupled to said first, second and third pluralities of signal terminals, for providing a first plurality of internal signals and receiving a second plurality of internal signals;

a first test signal bus, coupled to said first and third pluralities of signal terminals, for receiving a first plurality of test signals therefrom;

a first plurality of signal switches, coupled between said first test signal bus and said first plurality of logic circuits, for receiving said first plurality of internal signals and for receiving a first plurality of control signals and in accordance therewith communicating either said first plurality of internal signals or said first plurality of test signals to said first plurality of logic circuits as said first plurality of logic signals;

a second test signal bus, coupled to said second and third pluralities of signal terminals, for providing a second plurality of test signals thereto;

a second plurality of signal switches, coupled between said first plurality of logic circuits and said second test signal bus, for receiving a second plurality of control signals and in accordance therewith communicating said second plurality of logic signals either to said second test signal bus as said second plurality of test signals or to said second plurality of logic circuits as said second plurality of internal signals;

a first plurality of output drivers, coupled to said second plurality of signal terminals, for receiving a third plurality of control signals and in accordance therewith providing said first plurality of output signals, wherein each one of said first plurality of output signals is set to one of a plurality of logic states in accordance with said third plurality of control signals;

a second plurality of output drivers, coupled to said third plurality of signal terminals, for receiving a fourth plurality of control signals and in accordance therewith providing said second plurality of output signals, wherein each one of said second plurality of output signals is set to one of a plurality of logic states in accordance with said fourth plurality of control signals; and a logic circuit coupled to said first and third pluralities of signal terminals, for receiving said first and second pluralities of input signals and in accordance therewith providing an input status signal representing a logic status of said first and second pluralities of input signals.

12. The apparatus of claim 11, wherein said plurality of input signal switches comprises a plurality of multiplexors.

13. The apparatus of claim 11, wherein said plurality of output signal switches comprises a plurality of tri-state buffers.

14. The apparatus of claim 11, wherein said plurality of output signal switches comprises a plurality of demultiplexors.

15. The apparatus of claim 11, further comprising a test controller for receiving a plurality of test control signals and in accordance therewith providing said first and second pluralities of control signals.

16. The apparatus of claim 14, wherein said plurality of test control signals comprises a test mode enablement signal and a plurality of programmable test mode select signals.

17. The apparatus of claim 11, wherein each one of said first plurality of output signals is set to a logic zero, logic one or high impedance state in accordance with said first plurality of control signals.

18. The apparatus of claim 11, wherein each one of said second plurality of output signals is set to a logic zero, logic one or high impedance state in accordance with said second plurality of control signals.

19. The apparatus of claim 11, wherein said logic circuit comprises an AND gate.

* * * * *

UNITED STATES PATENT AND TRADEMARK OFFICE
CERTIFICATE OF CORRECTION

PATENT NO. : 5,541,935
DATED       : July 30, 1996
INVENTOR(S) : Kent B. Waterson It is certified that error appears in the above-indentified patent and that said Letters Patent is hereby corrected as shown below:

In Col. 9, line 14, after "circuit" insert --,--.

Signed and Sealed this

Twelfth Day of November, 1996

Attest:

BRUCE LEHMAN

*Attesting Officer*            *Commissioner of Patents and Trademarks*